United States Patent
Nishide et al.

(10) Patent No.: US 10,727,388 B2
(45) Date of Patent: Jul. 28, 2020

(54) THERMOELECTRIC CONVERSION MATERIAL, THERMOELECTRIC CONVERSION MODULE USING THE SAME, AND MANUFACTURING METHOD THEREOF

(71) Applicant: HITACHI METALS, LTD., Tokyo (JP)

(72) Inventors: Akinori Nishide, Tokyo (JP); Naoto Fukatani, Tokyo (JP); Jyun Hayakawa, Tokyo (JP)

(73) Assignee: HITACHI METALS, LTD., Tokyo (JP)

( * ) Notice: Subject to any disclaimer, the term of this patent is extended or adjusted under 35 U.S.C. 154(b) by 0 days.

(21) Appl. No.: 16/411,206

(22) Filed: May 14, 2019

(65) Prior Publication Data
US 2020/0136004 A1  Apr. 30, 2020

(30) Foreign Application Priority Data
Jun. 14, 2018  (JP) .................... 2018-113557

(51) Int. Cl.
*H01L 35/22* (2006.01)
*H01L 35/34* (2006.01)
*H01L 35/32* (2006.01)

(52) U.S. Cl.
CPC .............. *H01L 35/22* (2013.01); *H01L 35/32* (2013.01); *H01L 35/34* (2013.01)

(58) Field of Classification Search
USPC ....................................... 136/139
See application file for complete search history.

(56) References Cited

U.S. PATENT DOCUMENTS

2015/0136195 A1*  5/2015  Nishide ............... C22C 33/0278
                                                                136/239
2018/0294394 A1   10/2018  Nishide et al.

FOREIGN PATENT DOCUMENTS

WO      2016/185852 A1    11/2016

* cited by examiner

*Primary Examiner* — Magali P Slawski
(74) *Attorney, Agent, or Firm* — Volpe and Koenig, P.C.

(57) ABSTRACT

There is provided a thermoelectric conversion material formed of an $Fe_2TiSi$-based full-Heusler alloy to which La is added, wherein La is solid-dissolved in the $Fe_2TiSi$-based full-Heusler alloy.

13 Claims, 7 Drawing Sheets

THERMOELECTRIC CONVERSION MATERIAL, THERMOELECTRIC CONVERSION MODULE USING THE SAME, AND MANUFACTURING METHOD THEREOF

The present application claims priority from Japanese application serial no. JP2018-113557, filed on Jun. 14, 2018, the content of which is hereby incorporated by reference into this application.

BACKGROUND OF THE INVENTION

1. Field of the Invention

The present invention relates to a thermoelectric conversion material, a thermoelectric conversion module using a thermoelectric conversion material, and a manufacturing method of a thermoelectric conversion material.

2. Description of the Related Art

In recent years, in accordance with the growing interest in an energy problem, effective utilization of exhaust heat generated in a process of using primary energy has become an important issue along with use of renewable energy. An amount of exhaust heat energy occupies about 60% of the primary energy, and most of the exhaust heat energy is generated in a wide range of places such as plants, industrial infrastructures, consumer products, and mobility.

The use of the exhaust heat used as heat has increased due to the development of a heat pump technology, but there is also a great demand to convert the exhaust heat to electricity to use the exhaust heat as electric power. A system realizing conversion of the heat to the electric power is mainly a large Rankine cycle (turbine) power generation system, which is a steam engine operated with high pressure steam of a liquid medium. However, the exhaust heat dispersed over a wide range is not suitable for a system that performs electric power conversion with overconcentration.

As a technology for overcoming the problem as described above, a thermoelectric conversion system using a Seebeck effect in which materials generate a voltage due to a temperature difference has been known. Since the thermoelectric conversion system does not include a drive unit such as a turbine, the thermoelectric conversion system can be miniaturized and is suitable for heat recovery at a wide range of temperatures.

As a thermoelectric conversion material using non-toxic and inexpensive elements used for the thermoelectric conversion system using the Seebeck effect where the materials generate the voltage due to the temperature difference, an Fe-based full Heusler alloy has been known. The Fe-based full Heusler alloy is a thermoelectric conversion material containing inexpensive and non-toxic elements such as Fe, V, Al, Si, and Ti as main components. In particular, an $Fe_2TiSi$-based full Heusler alloy in which a ratio of V of these constituent elements is remarkably decreased has been invented in recent years. WO 2016/185852 A, and the like disclose such an $Fe_2TiSi$-based full Heusler alloy.

Here, a full Heusler alloy will further be described. The full Heusler alloy belongs to a Heusler alloy, but the Heusler alloy has two classifications, the full Heusler alloy and a half Heusler alloy. The full Heusler alloy and the half Heusler alloy are classified by a composition formula and crystal structure. In a case where constituent elements are X, Y, and Z, a composition formula of the full Heusler alloy is $X_2YZ$, and a crystal structure of the full Heusler alloy is $L2_1$ structure. On the other hand, in a case of the half Heusler alloy, a composition formula of the half Heusler alloy is XYZ, and a crystal structure of the half Heusler alloy is a $C1_b$ structure. That is, even in a case where the constituent elements X, Y, and Z or additive elements are the same as each other, when the full Heusler alloy is specified, a state of load electrons is different from that of the half Heusler alloy to be clearly distinguished scientifically from that of the half Heusler alloy.

SUMMARY OF THE INVENTION

As described in WO 2016/185852 A, thermoelectric conversion efficiency of a thermoelectric conversion module depends on a dimensionless figure of merit ZT. Here, ZT is a dimensionless figure of merit obtained by multiplying a figure of merit Z by an absolute temperature T, and $Z=S^2/(\kappa\rho)$ (S is a Seebeck coefficient, $\rho$ is electrical resistivity, and $\kappa$ is thermal conductivity). Therefore, in order to improve an output of the thermoelectric conversion module, it is necessary to increase a Seebeck coefficient S of a thermoelectric conversion material, decrease electrical resistivity $\rho$ of the thermoelectric conversion material, and decrease thermal conductivity $\kappa$ of the thermoelectric conversion material. In WO 2016/185852 A, it is pointed out that it is preferable to add Cu to the $Fe_2TiSi$-based full Heusler alloy in order to obtain high thermoelectric conversion characteristics.

However, in the Fe-based full Heusler alloy disclosed in WO 2016/185852 A, an approach to form a low resistance alloy and a composite material in order to decrease the electrical resistivity $\rho$, thereby simultaneously decreasing the thermal conductivity $\kappa$ and the electrical resistivity $\rho$ to increase the ZT is adopted. However, in this approach, S is simultaneously decreased, which hinders the ZT from being further increased.

Therefore, an object of the present invention is to prevent decrease in a Seebeck coefficient S of an Fe-based full Heusler alloy.

One preferred aspect of the present invention is a thermoelectric conversion material formed of an $Fe_2TiSi$-based full-Heusler alloy to which La is added, wherein La is solid-dissolved in the $Fe_2TiSi$-based full-Heusler alloy.

Another preferred aspect of the present invention is a thermoelectric conversion unit; and a first electrode and a second electrode that are in electrical and thermal contact with the thermoelectric conversion unit, wherein at least a part of the thermoelectric conversion unit is formed of a thermoelectric conversion material, and the thermoelectric conversion material is formed of an $Fe_2TiSi$-based full-Heusler alloy to which La is added, La being solid-dissolved in the $Fe_2TiSi$-based full-Heusler alloy.

Still another preferred aspect of the present invention is a manufacturing method of a thermoelectric conversion material, including: preparing amorphized raw material powders containing Fe, Ti, Si, and La; heat-treating the amorphized raw material powders; and cooling a product after the heat-treating, wherein an $Fe_2TiSi$-based full Heusler alloy in which La is solid-dissolved is obtained.

Cu may be added to the $Fe_2TiSi$-based full Heusler alloy described above. In addition, other elements substituting for Ti or Si may be contained the $Fe_2TiSi$-based full Heusler alloy.

According to the present invention, it is possible to improve a Seebeck coefficient S of an Fe-based full Heusler alloy.

DESCRIPTION OF THE PREFERRED EMBODIMENTS

Figure 1A:
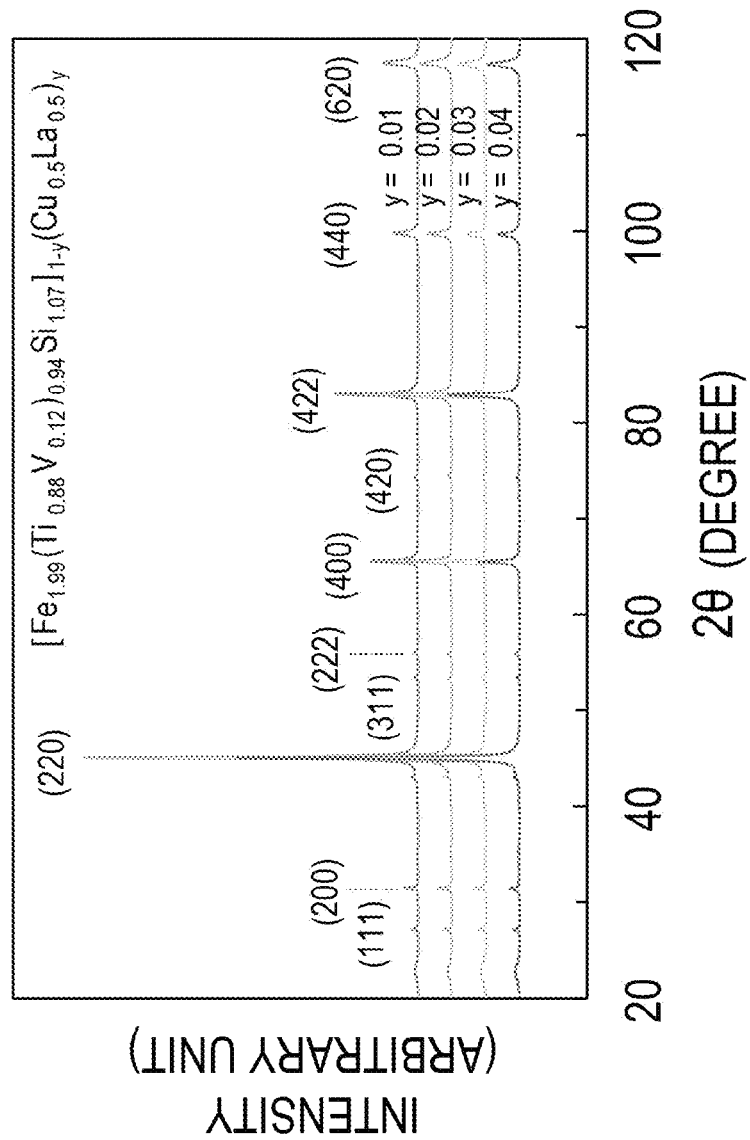
FIG. 1A is a graph illustrating a X-ray diffraction (XRD) profile of a LaCu-added $Fe_2TiSi$-based full Heusler alloy according to Example.

The following embodiment will be divided into and described as a plurality of sections or embodiments, if necessary, for convenience, but unless clearly stated, the plurality of sections or embodiments are not independent of each other, and one of the plurality of sections or embodiments is in a relationship such as a modification, details, or supplementary explanation with a part or the entirety of the other thereof.

In addition, in the following embodiment, in a case where the number, and the like (including the number, a numerical value, an amount, a range, and the like) of elements are mentioned, unless clearly stated and unless the number is obviously limited to a specific number in principle, the number is not limited to the specific number, and may be the specific number or more or the specific number or less.

Further, in the following embodiment, components (including elements, steps, and the like) of the embodiment are not necessarily indispensable unless clearly stated and unless considered to be obviously indispensable in principle. Similarly, in the following embodiment, when shapes, positional relationships, and the like of the components are mentioned, unless clearly stated and unless considered to be obviously stated in principle, it is considered that the shapes, and the like of the components include shapes and the like substantially close or similar to these shapes, and the like. The same goes for the numerical value and the range described above.

Hereinafter, an embodiment of the present invention will be described in detail with reference to the drawings. It should be noted that throughout all the drawings for describing the embodiments, members having the same functions will be denoted by the same reference numerals and a repetitive description thereof will be omitted. In addition, in the following embodiment, a description of the same or similar parts will not be repeated in principle unless particularly necessary.

In addition, in the following embodiment, in a case where a range is indicated as a range of A to B, it is considered that the range indicate a range of A or more and B or less, unless clearly specified.

The following Example discloses that a decrease in a Seebeck coefficient S can be suppressed or the Seebeck coefficient can be improved by solid-dissolving La in an $Fe_2TiSi$-based full Heusler alloy. This full Heusler alloy is referred to as a La-solid-dissolved $Fe_2TiSi$-based full Heusler alloy herein. As well-known, even though other atoms enter a crystal structure of any metal, a state where a form of an original crystal structure is maintained and the atoms are mixed with any metal in a solid state is called a solid-dissolved state.

In another example, it is shown that a Seebeck coefficient S is increased by adding La and Cu in a total amount of up to about 2 at % to the $Fe_2TiSi$-based full Heusler alloy. In a case where La and Cu are added in a total amount of 0.5 at % or more and 2 at % or less, a thermoelectric conversion material of a full Heusler alloy obtains a high level of Seebeck coefficient of $|S|>170$ μV/K. Further, by substituting Ti of the $Fe_2TiSi$-based full Heusler alloy with V by about 2.0 to 2.5 at % in a state where La and Cu are added, the thermoelectric conversion material of the full Heusler alloy obtains the highest level of $|S|=197$ μV/K.

As another Example, there is provided a manufacturing method of a thermoelectric conversion material, including: preparing amorphized raw material powders of a La-solid-dissolved $Fe_2TiSi$-based full Heusler alloy, heat-treating the amorphized raw material powders, and cooling a product after the heat-treating.

<1. Structure of Thermoelectric Conversion Material>

The present inventors propose a La-solid-dissolved $Fe_2TiSi$-based full Heusler alloy as a thermoelectric conversion material according to the present embodiment. As a specific configuration example, an $Fe_2TiSi$-based full Heusler alloy containing both of La and Cu is adopted. This full Heusler alloy will be referred to as a LaCu-added $Fe_2TiSi$-based full Heusler alloy. A specific structure is a structure in a state where La atoms and Cu atoms are solid-dissolved in the $Fe_2TiSi$-based full Heusler alloy.

As a configuration capable of expressing the abovementioned feature and principle, a full Heusler alloy represented by a composition formula $Fe_2TiSi$, that is, a $Fe_2TiSi$-based full Heusler alloy is adopted. In other words, the thermoelectric conversion material according to the present embodiment is formed of a full Heusler alloy containing iron (Fe), titanium (Ti), and silicon (Si) as main components.

Here, the meaning that the full Heusler alloy contains iron, titanium and silicon as the main components in the present specification, and the like is that a content of iron exceeds 25 at % (atom %), a content of titanium exceeds 12.5 at %, and a content of silicon exceeds 12.5 at %.

That is, the $Fe_2TiSi$-based full Heusler alloy referred to in the present specification, and the like means that X sites exceeding 50% among all X sites are occupied by iron atoms, in a full Heusler alloy having an $L2_1$-type crystal structure represented by $X_2YZ$. In addition, the $Fe_2TiSi$-based full Heusler alloy means that Y sites exceeding 50% among all Y sites are occupied by titanium atoms and Z sites exceeding 50% among all Z sites are occupied by silicon atoms, in the full Heusler alloy having the $L2_1$-type crystal structure represented by $X_2YZ$.

In a case where a small amount of La and Cu is solid-dissolved in the $Fe_2TiSi$-based full Heusler alloy represented as described above to exist in a crystal lattice of the $Fe_2TiSi$-based full Heusler alloy, since hole carriers are supplied particularly from La, a total carrier concentration is decreased and an electronic state becomes semi-conductive, such that an absolute value of the Seebeck coefficient S is increased. Cu acts as an auxiliary element for solid-dissolving La that cannot be originally dissolved in the $Fe_2TiSi$-based full Heusler alloy in the $Fe_2TiSi$-based full Heusler alloy. By setting a total amount of added Cu and La to be about 2 at %, the Seebeck coefficient of $|S|>170$ µV/K can be obtained, which is preferable.

<2. Manufacturing Method of Thermoelectric Conversion Material>

A desirable method of obtaining the thermoelectric conversion material according to Example described above will be described. For example, by heat-treating amorphized raw material powders of a LaCu-added $Fe_2TiSi$-based full Heusler alloy, a crystal in which La atoms and Cu atoms are solid-dissolved in the crystal lattice of the $Fe_2TiSi$-based full Heusler alloy is obtained. In addition, in a case of adopting the present method, a thermoelectric conversion material formed of fine crystal grains of which an average grain size is less than 1 µm can be manufactured as a secondary effect. As an example of a method of measuring the average grain size, an average value of measurement results of crystal grains in a predetermined range of a sample may be calculated. In a case where a major axis and a minor axis exist in the grain size, the major axis and the minor axis can also be averaged. Since it can be assumed that a composition of the sample is uniform in a general manufacturing method, the average grain size of the entire sample is substantially obtained. In addition, as a method of manufacturing the amorphized raw material powders of the LaCu-added $Fe_2TiSi$-based full Heusler alloy, a mechanical alloying method, a method of dissolving and then rapidly quenching a raw material, and the like can be used.

In a step of heat-treating the amorphized raw material powders of the LaCu-added $Fe_2TiSi$-based full Heusler alloy, an average grain size of the crystal grains of the manufactured thermoelectric conversion material becomes large as a heat treatment temperature becomes higher and as a heat treatment time becomes longer. The average grain size of the crystal grains can be controlled by appropriately setting the heat treatment temperature and time. For example, it is preferable that the heat treatment temperature is 550 to 700° C., and it is preferable that the heat treatment time is preferably 3 minutes or more and 10 hours or less.

Thermal conductivity κ can be expected to be decreased by refinement of the crystal grains. A main factor of the decrease in K is estimated to be phonon scattering generated at a crystal grain interface increased by the refinement of the crystal grains. On the other hand, when the crystal grains are excessively small, a crystal structure becomes unstable. Here, in order to obtain a fine crystal of which an average grain size of crystal grains is 10 nm or more and 100 nm or less, it is preferable to put the amorphized raw material powders of the LaCu-added $Fe_2TiSi$-based full Heusler alloy in a die formed of carbon or a die formed of tungsten carbide and sinter the amorphized raw material powders of the LaCu-added $Fe_2TiSi$-based full Heusler alloy in an inert gas atmosphere while applying a pulse current to the amorphized raw material powders of the LaCu-added $Fe_2TiSi$-based full Heusler alloy under a pressure of 40 MPa to 5 GPa. At the time of this sintering, it is preferable to raise a temperature to a target temperature in the range of 550 to 700° C., maintain the temperature at the target temperature for 3 to 180 minutes, and then lower the temperature to room temperature.

As a method of amorphizing the raw material of the LaCu-added $Fe_2TiSi$-based full Heusler alloy, a method such as roll quenching or atomizing can be used. In a case where the amorphized raw material is not obtained in a powder form, a method of performing hydrogen embrittlement on the amorphized raw material to pulverize the amorphized raw material in an environment where oxidation is prevented may be used.

As a method of molding the raw material, various methods such as press molding can be used. It is also possible to obtain a sintered body in which a magnetic field is oriented by performing the sintering in the magnetic field. In addition, discharge plasma sintering that can simultaneously perform the press molding and the sintering can also be used.

Example 1

A thermoelectric conversion material according to the present Example is formed of an n-type full Heusler alloy represented by the following composition. It is a composition of a full Heusler alloy, but is a La-solid-dissolved $Fe_2TiSi$-based full Heusler alloy. A more specific composition is an $Fe_2TiSi$-based full Heusler alloy into which La and Cu are added and La is solid-dissolved.

The $Fe_2TiSi$-based full Heusler alloy refers to an alloy containing Fe, Ti, and Si as main components, having a composition adjusted in the vicinity of an atomic weight ratio of Fe:Ti:Si=50 (at %):25 (at %):25 (at %), and having a crystal structure of a full Heusler alloy. For example, an alloy of Fe:Ti:Si=48 (at %):25 (at %):27 (at %) in which a ratio of Fe, Ti, and Si is a nonstoichiometric ratio is also defined to be included in a category of the $Fe_2TiSi$-based full Heusler alloy. In addition, an alloy in which element substitution is conducted in order to maximize an absolute value of a Seebeck coefficient is also similarly expressed as the $Fe_2TiSi$-based full Heusler alloy. For example, in an n-type $Fe_2TiSi$-based full Heusler alloy, as suggested in WO 2016/185852 A, in order to maximize the absolute value of the Seebeck coefficient S, V, or the like may be substituted by Ti in an appropriate amount. However, this case is also expressed as the $Fe_2TiSi$-based full Heusler alloy.

A LaCu-added $Fe_2TiSi$-based full Heusler alloy, which is the thermoelectric conversion material according to the present Example, was prepared. First, as for an $Fe_2TiSi$-based full Heusler alloy, $Fe_2TiVSi$ in which Ti was partially substituted with V was adopted. Specifically, in a thermoelectric conversion material formed of a full Heusler alloy having an $L2_1$-type crystal structure represented by $X_2YZ$, iron (Fe), titanium (Ti), and silicon (Si) were used as raw materials that become main components of each of X sites, Y sites and Z sites. In addition, vanadium (V) was used as a raw material substituting for the main component of the Y sites. Further, aluminum (Al) may be used as a raw material substituting for the main component of the Z sites. Then, the respective raw materials were weighed so that the manufactured thermoelectric conversion material had a desired composition.

Then, these raw materials were put in a container formed of stainless steel in an inert gas atmosphere, and were mixed with balls having a diameter of 10 mm and formed of stainless steel. Then, mechanical alloying using a planetary ball mill apparatus was performed on the mixture, and was performed at a revolution speed of 200 to 500 rpm for 20 hours or more to obtain amorphized alloy powders. In a case where there is no scattering and the raw materials are obtained as a 100% $Fe_2TiSi$-based full Heusler alloy, for example, a total amount of added La and Cu contained in raw material powders is 2 at % or less, more preferably, 0.5 at % or more or 2 at % or less. In addition, an element to substitute for at least one of Ti and Si may be contained in the raw material powders.

The amorphized alloy powders were put in a die formed of carbon or a die formed of tungsten carbide, and were sintered in an inert gas atmosphere while applying a pulse current under a pressure of 40 MPa to 5 GPa. At the time of this sintering, a temperature was raised to a target temperature in the range of 550 to 700° C., was maintained at the target temperature for 3 to 180 minutes, and was then lowered to room temperature to obtain the thermoelectric conversion material.

An average grain size of crystal grains of the obtained $Fe_2TiSi$-based full Heusler alloy was evaluated by an X-ray diffraction (XRD) method and a transmission electron microscopy (TEM). In addition, as thermoelectric conversion characteristics of the obtained thermoelectric conversion material, electrical resistivity $\rho$ and a Seebeck coefficient S were measured using a thermoelectric property evaluation apparatus ZEM (manufactured by ADVANCE RIKO, Inc.).

FIG. 1A illustrates an XRD profile of the obtained LaCu-added $Fe_2TiSi$-based full Heusler alloy. A composition formula of a sample is $[Fe_{1.99}(Ti_{0.88}V_{0.12})_{0.94}Si_{1.07}]_{1-y}(Cu_{0.5}La_{0.5})_y$, and La and Cu are added in a total amount of y=1 at %, 2 at %, 3 at %, and 4 at %. In the XRD profile, diffraction peaks such as (111), (200), and (220) can be confirmed regardless of an amount of added La and Cu, and it can thus be said that an $Fe_2TiSi$-based full Heusler alloy having a desired crystal structure is obtained. Particularly, when the amount of added La and Cu is at most 2 at %, changes are hardly observed in the diffraction peaks.

Figure 1B:
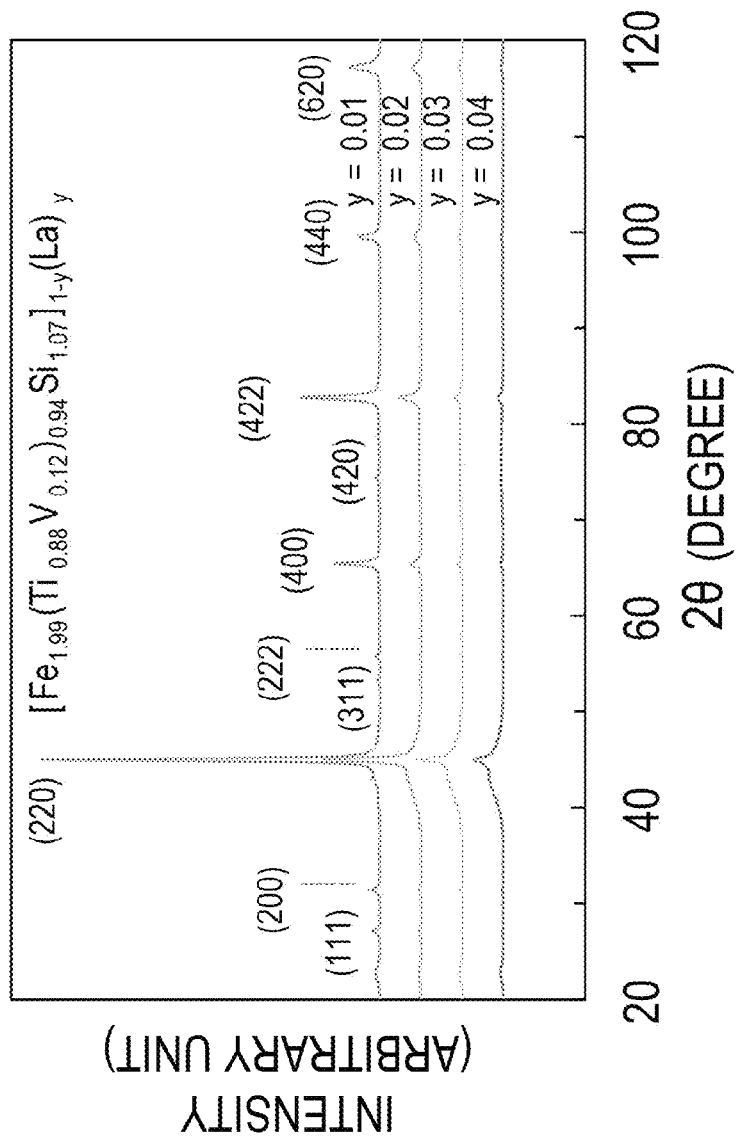
FIG. 1B is a graph illustrating an XRD profile of a La-added $Fe_2TiSi$-based full Heusler alloy according to Comparative Example.

FIG. 1B illustrates an XRD profile of an $Fe_2TiSi$-based full Heusler alloy in a case where La is added alone for comparison. A composition formula of a sample is $[Fe_{1.99}(Ti_{0.88}V_{0.12})_{0.94}Si_{1.07}]_{1-y}(La)_y$, and it can be seen that even though an amount of added La is about 2 at %, diffraction peaks are weakened as illustrated in FIG. 1B.

Figure 1C:
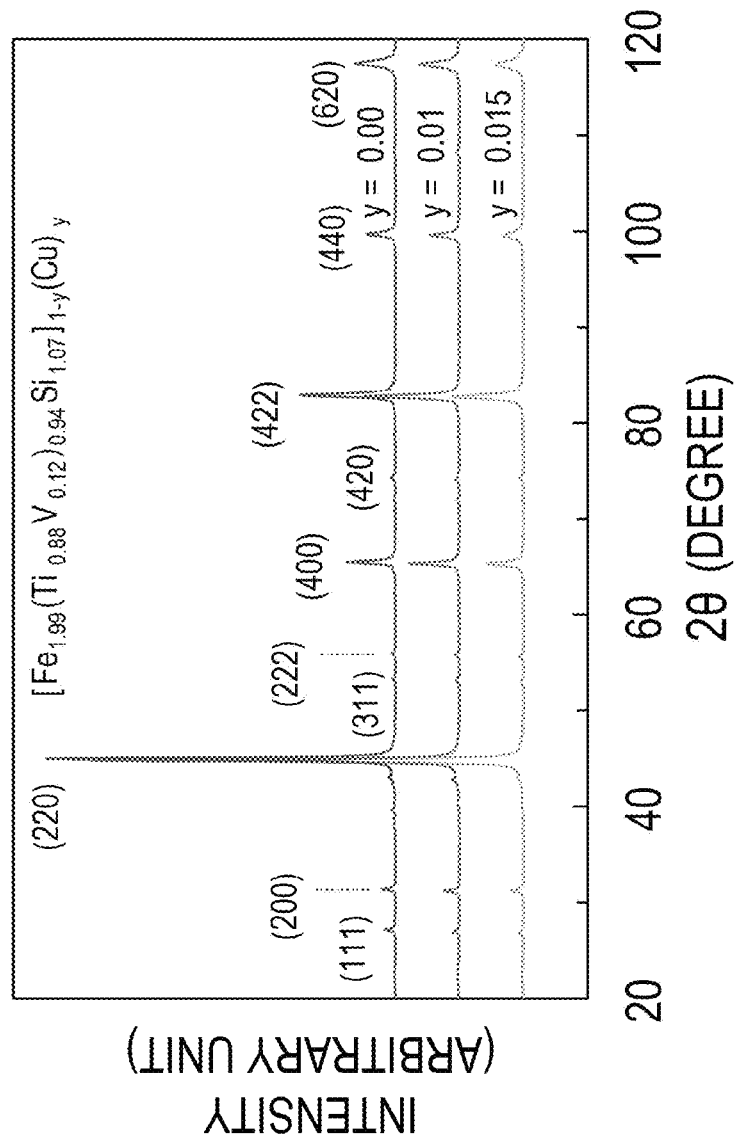
FIG. 1C is a graph illustrating an XRD profile of a Cu-added $Fe_2TiSi$-based full Heusler alloy according to Comparative Example.

FIG. 1C illustrates an XRD profile of an $Fe_2TiSi$-based full Heusler alloy in a case where Cu is added alone for comparison. A composition formula of a sample is $[Fe_{1.99}(Ti_{0.88}V_{0.12})_{0.94}Si_{1.07}]_{1-y}(Cu)_y$, and diffraction peaks such as (111), (200), and (220) can be confirmed regardless of an amount of added Cu, and it can thus be said that an $Fe_2TiSi$-based full Heusler alloy having a desired crystal structure is obtained.

Figure 2A:
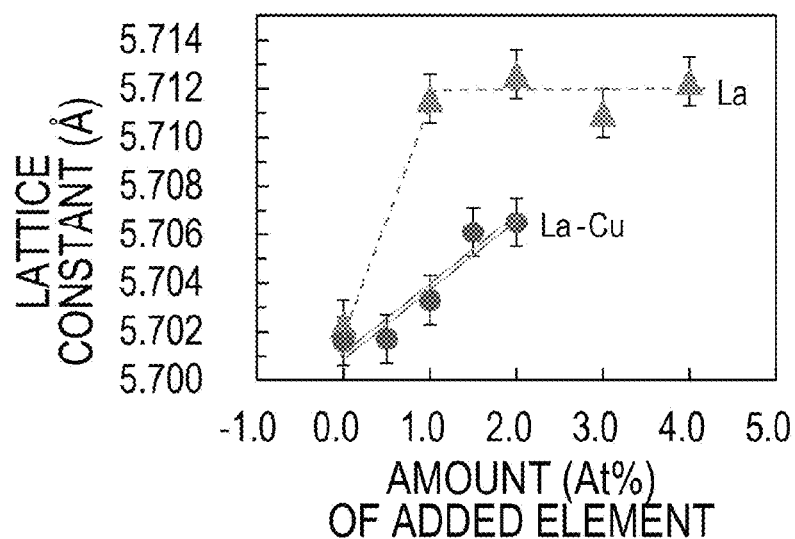
FIG. 2A is a graph illustrating a result obtained by calculating lattice constants of the LaCu-added $Fe_2TiSi$-based full Heusler alloy according to Example and the La-added $Fe_2TiSi$-based full Heusler alloy according to Comparative Example from the XRD profiles.
Figure 2B:
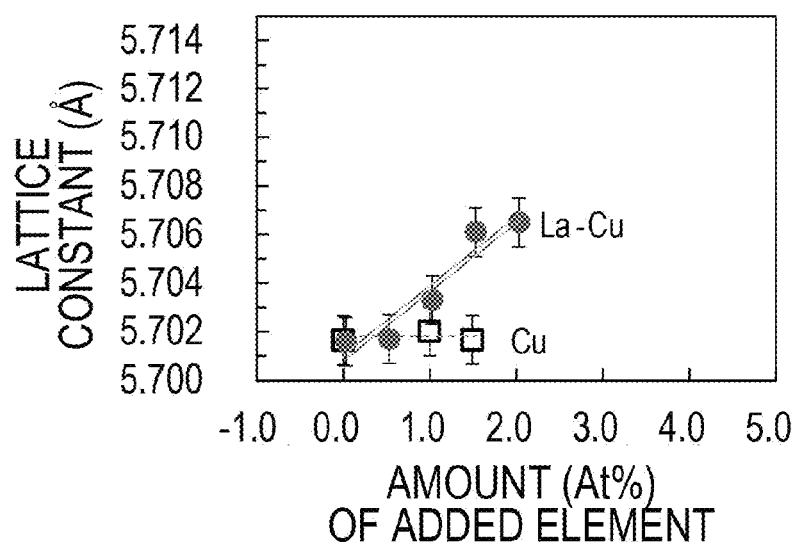
FIG. 2B is a graph illustrating a result obtained by calculating lattice constants of the LaCu-added $Fe_2TiSi$-based full Heusler alloy according to Example and the Cu-added $Fe_2TiSi$-based full Heusler alloy according to Comparative Example from the XRD profiles.

FIGS. 2A and 2B illustrate results obtained by calculating lattice constants of the obtained LaCu-added $Fe_2TiSi$-based full Heusler alloys from the XRD profiles. A composition formula of a sample is the same as that illustrated in FIG. 1A, and an amount y of added La and Cu is changed. That is, the amount of added La and Cu represents a total value, and a ratio of La and Cu is 1:1.

In FIG. 2A, a lattice constant of the LaCu-added $Fe_2TiSi$-based full Heusler alloy is monotonically increased as an amount of added LaCu is increased. In a solid solution, a relationship between a component and a lattice constant is linearly regulated according to the so-called Vegard's law. When a change of the lattice constant of the LaCu-added $Fe_2TiSi$-based full Heusler alloy is interpreted using the Vegard's law, it can be said that each element of LaCu is solid-dissolved in a lattice of the LaCu-added $Fe_2TiSi$-based full Heusler alloy.

Here, for comparison, a lattice constant of the $Fe_2TiSi$-based full Heusler alloy to which only La is added by the manufacturing method described above and a lattice constant of the $Fe_2TiSi$-based full Heusler alloy to which only Cu is added by the manufacturing method described above are illustrated together in FIGS. 2A and 2B, respectively.

In FIG. 2A, it can be seen that the lattice constant of the La-added $Fe_2TiSi$-based full Heusler alloy is increased in the range in which an amount of added La is 1 at % or less, but it remains stationary in the range in which an amount of added La is 1 at % or more.

In FIG. 2B, it can be seen that the lattice constant of the Cu-added $Fe_2TiSi$-based full Heusler alloy remains stationary regardless of an amount of added Cu. It can be seen from the above facts that only in the LaCu-added $Fe_2TiSi$-based full Heusler alloy to which both of La and Cu are added among three types of analyzed $Fe_2TiSi$-based full Heusler alloys, added elements are solid-dissolved in the range of the amount of added La and Cu up to 2 at %.

FIGS. 3A to 3E illustrate results of confirming an aspect in which La and Cu atoms are solid-dissolved in the LaCu-added $Fe_2TiSi$-based full Heusler alloy according to Example, using a scanning transmission electron microscope (STEM) and a scanning transmission electron microscope-energy dispersive X-ray analysis (STEM-EDX).

Figure 3C:
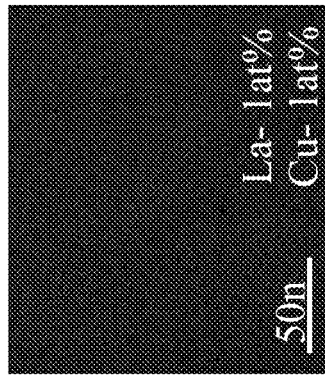
FIGS. 3A to 3E are views illustrating images, captured by a scanning transmission electron microscope (STEM) and a scanning transmission electron microscope-energy dispersive X-ray analysis (STEM-EDX), of the LaCu-added $Fe_2TiSi$-based full Heusler alloy according to Example.
Figure 3E:
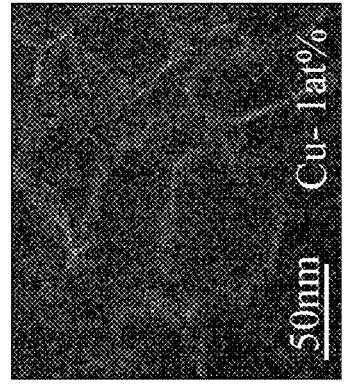
Figure 3B:
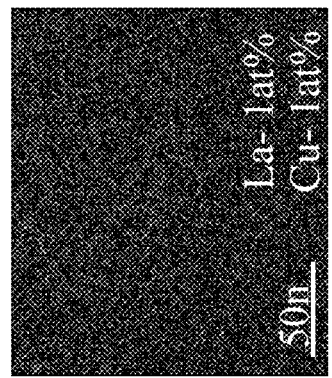
Figure 3D:
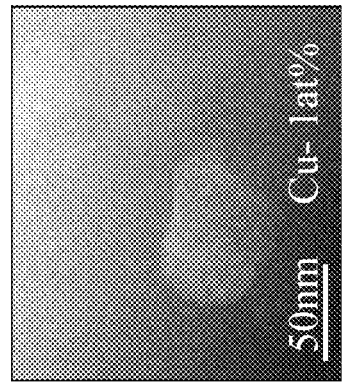
Figure 3A:
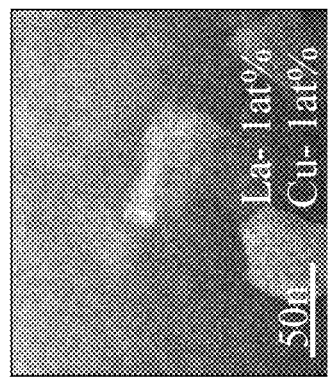

In FIGS. 3A, 3B and 3C, samples in which La is added in an amount of 1 at % and Cu is added in an amount of 1 at % are observed. In addition, for comparison, a STEM image and a STEM-EDX image for a sample in which Cu is added in an amount of 1 at % are illustrated in FIGS. 3D and 3E, respectively.

It can be seen that fine crystal grains of about 50 nm are present, from a STEM image of FIG. 3A. Further, it can be seen that precipitation is not observed in the $Fe_2TiSi$-based full Heusler alloy and Cu is evenly distributed in the $Fe_2TiSi$-based full Heusler alloy, from a STEM-EDX image of FIG. 3B. In addition, it can be seen that La is uniformly distributed in the $Fe_2TiSi$-based full Heusler alloy, from a STEM-EDX image of FIG. 3C.

On the other hand, for example, in a case where Cu is added alone, it can be seen that Cu is precipitated at a grain boundary as observed from the STEM-EDX image in FIG. 3E.

Summing up the above results of the structure analysis, in the LaCu-added $Fe_2TiSi$-based full Heusler alloy to which both of Cu and La are added, it could be seen that La and Cu atoms are solid-dissolved in the crystal lattice of the $Fe_2TiSi$-based full Heusler alloy, such that a La-solid-dissolved $Fe_2TiSi$-based full Heusler alloy is obtained.

Figure 4:
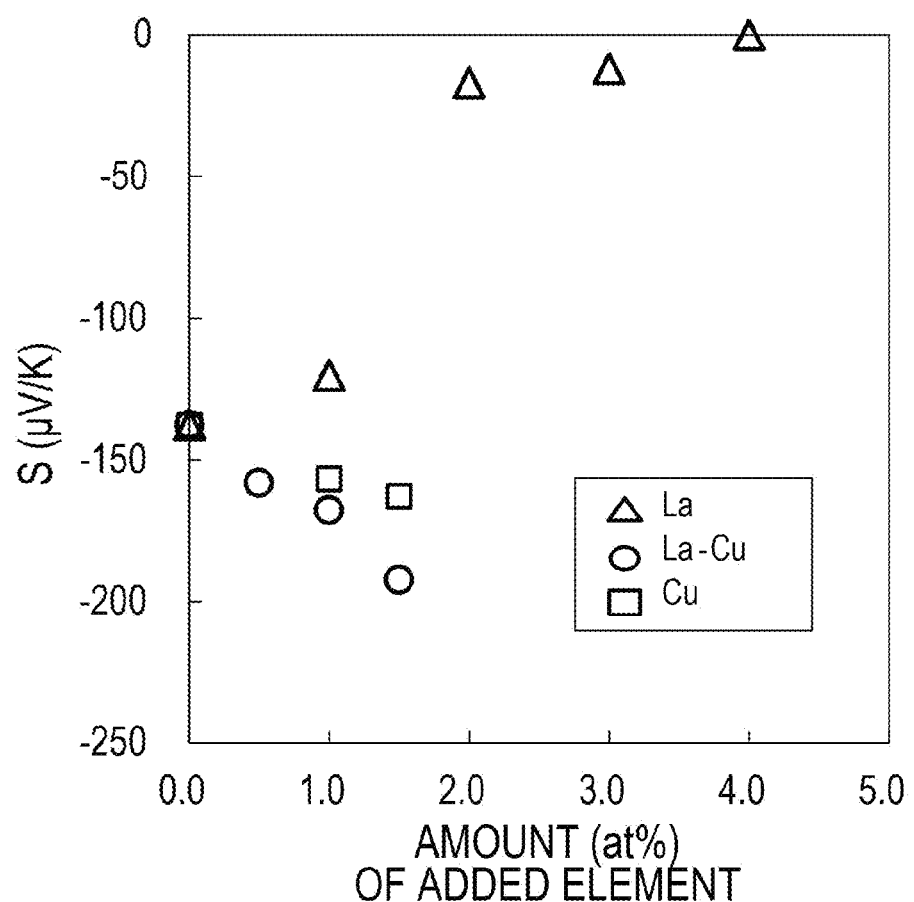
FIG. 4 is a graph illustrating Seebeck coefficients of the LaCu-added $Fe_2TiSi$-based full Heusler alloy according to Example and the La-added $Fe_2TiSi$-based full Heusler alloy and the Cu-added $Fe_2TiSi$-based full Heusler alloy according to Comparative Examples.

FIG. 4 illustrates a Seebeck coefficient of the obtained LaCu-added $Fe_2TiSi$-based full Heusler alloy. A horizontal axis is a total amount of added La and Cu. An absolute value $|S|$ of the Seebeck coefficient of the LaCu-added $Fe_2TiSi$-based full Heusler alloy is significantly increased from $|S|=137.5$ μV/K to 192.2 μV/K as an amount of added LaCu is increased. In particular, when the amount of added LaCu is in the range from 0.5 at % or more and 2.0 at % or less, an excellent Seebeck coefficient of |S|>170 µV/K can be obtained. On the other hand, |S| of the $Fe_2TiSi$-based full-Heusler alloy to which La is added alone is considered to be rapidly decreased in order to precipitate a metal phase as an amount of added La is increased. In addition, it can be seen that |S| of the $Fe_2TiSi$-based full-Heusler alloy to which Cu is added alone is improved to some extent, but an effect of addition of both of La and Cu is excellent.

As described above, it was shown that the absolute value of the Seebeck coefficient S can be increased by adding both of La and Cu as described in the present Example. In addition, it can be secondarily seen from observed images shown in FIGS. 3A to 3E that in that case, a grain size of crystal grains is about 100 nm. According to the present Example, it can be said that a more preferable form of the LaCu-added $Fe_2TiSi$-based full Heusler alloy is shown. Specifically, it could be seen that a LaCu-added $Fe_2TiSi$-based full-Heusler alloy in which La atoms increasing the absolute value of the Seebeck coefficient are solid-dissolved in a state where the grain size of the crystal grains was reduced up to about 100 nm can be formed.

Example 2

Figure 5:
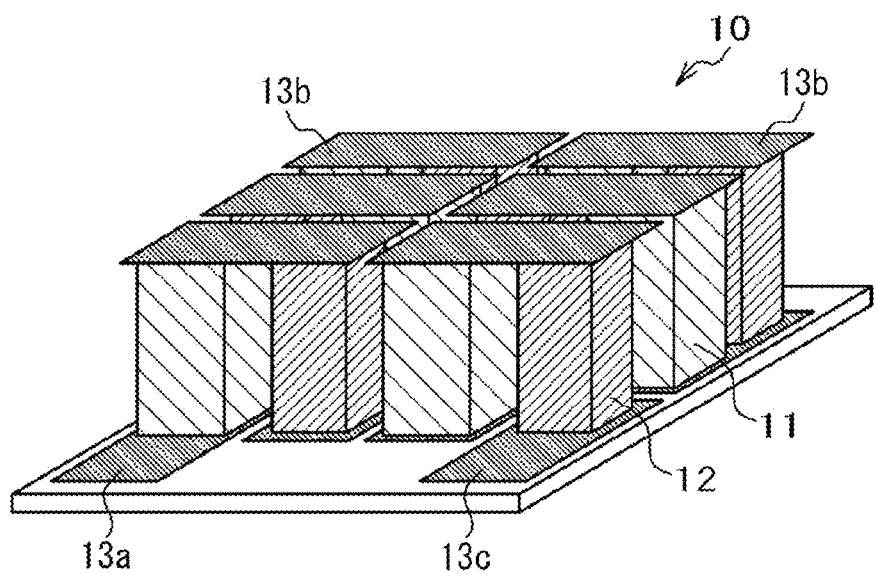
FIG. 5 is a perspective view illustrating a thermoelectric conversion module using a thermoelectric conversion material according to Example in a state before an upper substrate of the thermoelectric conversion module is mounted.

A thermoelectric conversion module using the thermoelectric conversion material described in Example 1 will be described with reference to FIGS. 5 and 6. FIG. 5 illustrates a state before an upper substrate is mounted, and FIG. 6 illustrates a state after the upper substrate is mounted.

Figure 6:
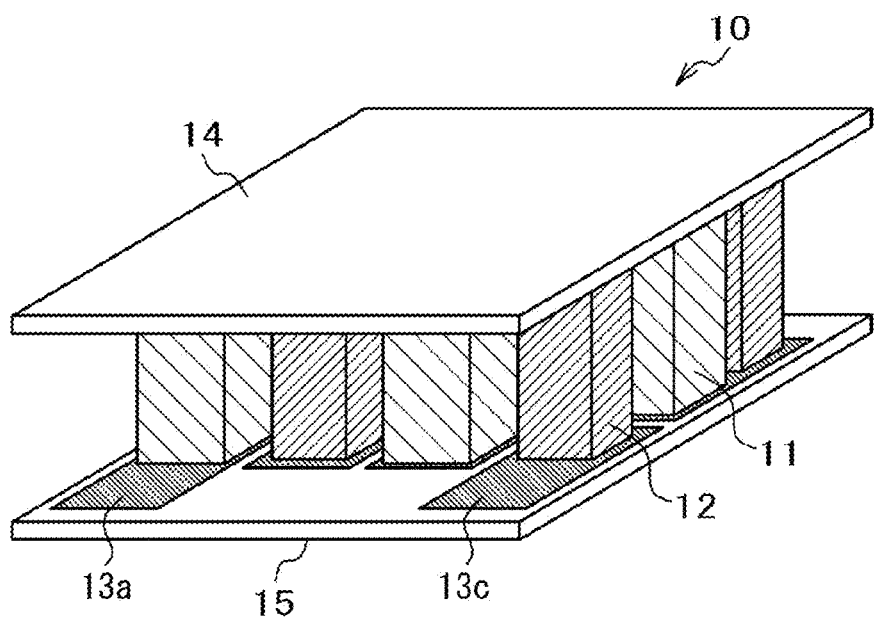
FIG. 6 is a perspective view illustrating the thermoelectric conversion module using the thermoelectric conversion material according to Example in a state after the upper substrate of the thermoelectric conversion module is mounted.

The thermoelectric conversion material formed of the LaCu-added $Fe_2TiSi$-based full Heusler alloy described above can be mounted on, for example, a thermoelectric conversion module 10 illustrated in FIGS. 5 and 6. The thermoelectric conversion module 10 includes p-type thermoelectric conversion units 11, n-type thermoelectric conversion units 12, a plurality of electrodes 13, an upper substrate 14, and a lower substrate 15. In addition, the thermoelectric conversion module 10 has electrodes 13a, 13b, and 13c as the plurality of electrodes 13.

The p-type thermoelectric conversion units 11 and the n-type thermoelectric conversion units 12 are connected to each other in series between the electrode 13a and the electrode 13c. Electrodes other than those illustrated as the electrode 13a and the electrode 13c are electrodes 13b, and the p-type thermoelectric conversion units 11 and the n-type thermoelectric conversion units 12, are connected to each other in series through the electrodes 13b, respectively. The electrodes 13a and 13c are formed on the lower substrate 15. A surface of the p-type thermoelectric conversion unit 11 facing the electrode 13a is in thermal contact with the lower substrate 15, and a surface of the p-type thermoelectric conversion unit 11 facing the electrode 13b is in thermal contact with the upper substrate 14. A surface of the n-type thermoelectric conversion unit 12 facing the electrode 13b is in thermal contact with the upper substrate 14, and a surface of the n-type thermoelectric conversion unit 12 facing the electrode 13c is in thermal contact with the lower substrate 15. As a result, a thermo-electromotive force generated between both ends of the p-type thermoelectric conversion unit 11 and a thermo-electromotive force generated between both ends of the n-type thermoelectric conversion unit are added to each other without being offset against each other between the electrode 13a and the electrode 13c, and a large thermo-electromotive force can thus be generated by the thermoelectric conversion module 10.

Each of the p-type thermoelectric conversion unit 11 and the n-type thermoelectric conversion unit 12 includes a thermoelectric conversion material. As the thermoelectric conversion material included in the n-type thermoelectric conversion unit 12, the thermoelectric conversion material according to the present embodiment can be used. As the thermoelectric conversion material included in the p-type thermoelectric conversion unit 11, a thermoelectric conversion material formed of a full Heusler alloy having a composition different from that of an $Fe_2TiSi$-based full Heusler alloy, such as $Fe_2NbAl$ or $FeS_2$ can be used.

Meanwhile, as a material for each of the upper substrate and the lower substrate 15, gallium nitride (GaN), silicon nitride ($Si_3N_4$), aluminum oxide, or the like can be used. As the material of the electrode 13, copper (Cu), gold (Au), or the like can be used. It is more preferable to select a combination of members for relieving stress.

The present invention is not limited to the abovementioned embodiment, but includes various modified examples. For example, some of the components of any embodiment can be replaced by components of another embodiment, and components of another embodiment can be added to components of any embodiment. In addition, it is possible to add, delete, and replace components of another embodiment with respect to some of the components of the respective embodiments.

What is claimed is:

1. A thermoelectric conversion material comprising a full-Heusler alloy containing $Fe_2TiSi$ to which La is added, wherein La is solid-dissolved in the full-Heusler alloy.

2. The thermoelectric conversion material according to claim 1, wherein Cu is further added to the full-Heusler alloy.

3. The thermoelectric conversion material according to claim 2, wherein a total amount of added La and Cu is 2 at % or less.

4. The thermoelectric conversion material according to claim 3, wherein the total amount of added La and Cu is 0.5 at % or more and 2 at % or less.

5. The thermoelectric conversion material according to any one of claims 1 to 4, wherein an average grain size of crystal grains of the full-Heusler alloy is 10 nm or more and 100 nm or less.

6. The thermoelectric conversion material according to claim 1, wherein a part of at least one of Ti and Si is substituted with another element.

7. The thermoelectric conversion material according to claim 6, wherein a part of Ti is substituted with V.

8. A thermoelectric conversion module comprising:
   a thermoelectric conversion unit; and
   a first electrode and a second electrode that are in electrical and thermal contact with the thermoelectric conversion unit,
   wherein at least a part of the thermoelectric conversion unit is comprised of a thermoelectric conversion material, and
   the thermoelectric conversion material is the thermoelectric conversion material according to claim 1.

9. A manufacturing method of a thermoelectric conversion material, comprising:
   preparing amorphized raw material powders containing Fe, Ti, Si, and La;
   heat-treating the amorphized raw material powders; and
   cooling a product after the heat-treating,
   wherein an $Fe_2TiSi$-based full Heusler alloy in which La is solid-dissolved is obtained.

10. The manufacturing method of a thermoelectric conversion material according to claim 9, wherein Cu is further added to the raw material powders.

11. The manufacturing method of a thermoelectric conversion material according to claim 10, wherein a total amount of La and Cu added to the raw material powders is 2 at % or less.

12. The manufacturing method of a thermoelectric conversion material according to claim 11, wherein a total amount of La and Cu added to the raw material powders is 0.5 at % or more and 2 at % or less.

13. The manufacturing method of a thermoelectric conversion material according to claim 9, wherein the raw material powders contain another element substituting for a part of at least one of Ti and Si.

* * * * *